(12) United States Patent
Yue

(10) Patent No.: US 10,044,887 B2
(45) Date of Patent: *Aug. 7, 2018

(54) PLATEN DISPLAY SYSTEM

(71) Applicant: KYOCERA Document Solutions Inc., Osaka (JP)

(72) Inventor: Tommy Yue, Daly City, CA (US)

(73) Assignee: KYOCERA Document Solutions, Inc., Osaka (JP)

( * ) Notice: Subject to any disclaimer, the term of this patent is extended or adjusted under 35 U.S.C. 154(b) by 20 days.

This patent is subject to a terminal disclaimer.

(21) Appl. No.: 15/077,746

(22) Filed: Mar. 22, 2016

(65) Prior Publication Data
US 2017/0279989 A1    Sep. 28, 2017

(51) Int. Cl.
| H04N 1/04 | (2006.01) |
| H04N 1/00 | (2006.01) |
| H04N 1/10 | (2006.01) |
| G02F 1/1335 | (2006.01) |
| G02F 1/137 | (2006.01) |
| G06F 3/12 | (2006.01) |

(Continued)

(52) U.S. Cl.
CPC ......... H04N 1/00493 (2013.01); G02F 1/137 (2013.01); G02F 1/133514 (2013.01); H04N 1/0044 (2013.01); H04N 1/00411 (2013.01); H04N 1/1061 (2013.01); H01L 25/18 (2013.01); H01L 27/3234 (2013.01); H04N 2201/0094 (2013.01)

(58) Field of Classification Search
CPC ........... H04N 1/00352; H04N 1/00392; H04N 1/00397; H04N 1/00405; H04N 1/00411; H04N 1/00488; H04N 1/0049; H04N 1/00493; H04N 1/00681; H04N 1/00687; H04N 1/00705; H04N 1/00708; H04N 1/0075; H04N 1/3872; H04N 1/3873; H04N 1/1013; H04N 1/1017; H04N 1/193; H04N 1/00816; G03G 15/36; G03G 15/5016; G03G 15/605
USPC ........ 358/474, 488, 452, 453, 468; 399/184, 399/185, 10, 15, 72, 81
See application file for complete search history.

(56) References Cited

U.S. PATENT DOCUMENTS

| 4,518,999 A * | 5/1985 | Kurata ..................... H04N 1/38 358/488 |
| 4,992,828 A * | 2/1991 | Liston .................... G03G 15/36 399/184 |

(Continued)

FOREIGN PATENT DOCUMENTS

| JP | 07184005 A | * | 7/1995 |
| JP | 2004191447 A | * | 7/2004 |
| JP | 2004193718 A | * | 7/2004 |

*Primary Examiner* — Chad Dickerson
(74) *Attorney, Agent, or Firm* — West & Associates, A PC; Stuart J. West

(57) ABSTRACT

A multifunctional printer comprising a liquid crystal layer mounted below a platen, with a light source positioned below the platen and liquid crystal layer. The multifunctional printer can display images using the liquid crystal layer and light source, such that the images are visible to users on the platen. The images can be deactivated and the platen made clear when users choose to scan documents placed on the platen. The images can include print previews, user interface components, and/or scan lines that indicate the boundaries of a scan area on the platen.

18 Claims, 13 Drawing Sheets

(51) Int. Cl.
   *H01L 27/32*   (2006.01)
   *H01L 25/18*   (2006.01)

(56) References Cited

U.S. PATENT DOCUMENTS

| | | | | |
|---|---|---|---|---|
| 5,926,239 | A * | 7/1999 | Kumar | G02F 1/133617 349/69 |
| 6,870,648 | B2 * | 3/2005 | Sesek | H04N 1/00795 358/453 |
| 7,688,477 | B2 * | 3/2010 | Ikeno | H04N 1/00681 358/449 |
| 9,774,754 | B2 * | 9/2017 | Yue | H04N 1/10 |
| 2003/0038227 | A1 * | 2/2003 | Sesek | H01L 27/146 250/208.1 |
| 2004/0247202 | A1 * | 12/2004 | Stade | G06T 7/0004 382/276 |
| 2005/0093919 | A1 * | 5/2005 | Takatsuka | B41J 2/16523 347/30 |
| 2006/0039050 | A1 * | 2/2006 | Carver | G02B 5/32 359/32 |
| 2007/0098394 | A1 * | 5/2007 | Baggs | G03G 15/60 396/299 |
| 2009/0251739 | A1 * | 10/2009 | Cook | H04N 1/10 358/474 |
| 2015/0116795 | A1 * | 4/2015 | Kim | H04N 1/1061 358/497 |

* cited by examiner

PLATEN DISPLAY SYSTEM

BACKGROUND

Field of the Invention

The present disclosure relates to multifunctional printers (MFPs), particularly displaying images on or through the MFP's platen.

Background

Multifunctional printers (MFPs) that combine printing, scanning, and copying capabilities are often used in offices and other environments. MFPs often incorporate screens, such as black and white or color LCD (liquid crystal display) screens. Such screens can be used to indicate information to users, such as a number of copies to print, a paper size, a scan size, a print preview, or other information.

However, such screens are often relatively small and/or low resolution. As such, it can be difficult for users to discern details shown on the display. For example, users often desire to view a preview of a scanned document on a display before printing the scanned document, to confirm that it was scanned correctly before using ink and paper to print it. Most screens built in to MFPs are too small to display print previews at or near their actual size, and/or have resolutions that are insufficient to display print previews such that users can see small details in the print preview. As print previews are generally shown at a reduced size and/or at a low resolution, users can have difficulty discerning details in the print preview.

When scanning documents with an MFP, many users may not be sure of the exact dimensions of the document they want to scan, and can thus be unsure of what dimensions to select for the scan area on the MFP's platen. In other cases, users may become frustrated when the edges of a scanned document are cut off because the wrong scan size was selected, or when users do not realize they should have changed the scan area from a default size.

What is needed is an MFP that can display images on or through its platen, such that images can display a print preview at larger sizes and/or increased resolutions relative to other screens at the MFP, display lines on the platen indicating the boundaries of the current scan area, and/or display virtual controls for the MFP.

SUMMARY

The present disclosure provides a multifunctional printer comprising a housing defining an aperture spanned by a transparent platen, and an image sensor mounted below the platen that is configured to scan documents placed above the platen. A liquid crystal layer can be mounted below the platen, along with a light source mounted below the platen at a distance from the liquid crystal layer. The liquid crystal layer can be configured to be transparent when the image sensor is scanning a document. When the image sensor is not scanning a document, the liquid crystal layer can selectively display images on the platen by selectively blocking or letting light emitted by the light source pass through the liquid crystal layer.

The present disclosure also provides a multifunctional printer comprising a housing defining an aperture spanned by a transparent platen, and a liquid crystal display screen mounted at a distance below the platen inside the housing. The liquid crystal display screen can be configured to selectively display images visible through the platen.

The present disclosure also provides a multifunctional printer, comprising a housing defining an aperture spanned by a transparent platen, an organic electroluminescent display (OELD) coupled with the platen, and an image sensor mounted below the platen that is configured to scan documents placed above the platen. The OELD can be configured to be transparent when the image sensor is scanning a document but selectively display images on the platen when the image sensor is not scanning a document.

The present disclosure also provides a multifunctional printer, comprising a housing defining an aperture spanned by a transparent platen, a display surface mounted at a distance below the platen inside the housing, an image sensor mounted below the platen that is configured to scan documents placed above the platen, and a projector mounted above the platen. When the image sensor is not scanning a document, the projector can selectively project images through the platen onto the display surface.

DETAILED DESCRIPTION

Figure 1:
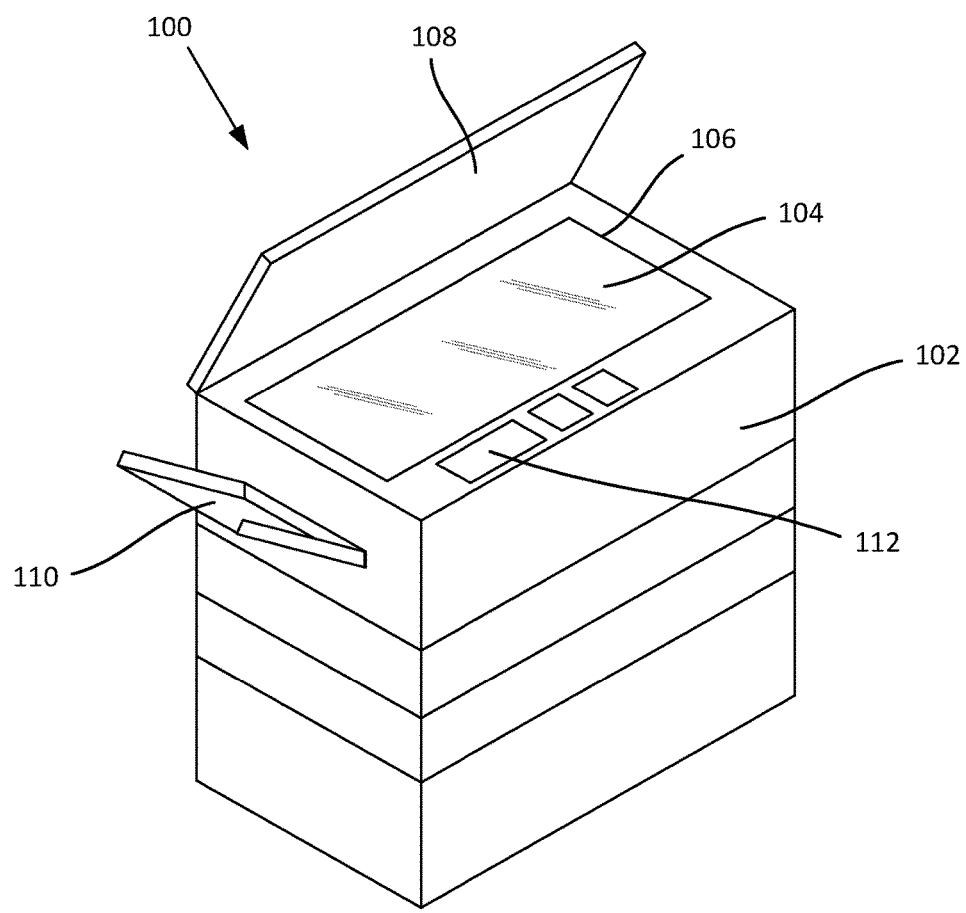
FIG. 1 depicts an external view of an embodiment of a multifunctional printer (MFP).

FIG. 1 depicts an external view of an embodiment of a multifunctional printer (MFP) 100, also known as a "multifunctional product" or "multifunctional system." An MFP 100 can be "all-in-one" machine that has a plurality of different functions such as printing, copying, scanning, and/or other functions.

The MFP 100 can comprise a housing 102 and a platen 104. The housing 102 can be a case or outer body that surrounds the interior of the MFP 100. The housing 102 can define an aperture 106 on an upper planer surface of the housing 102.

The platen 104 can be positioned to span and fill the aperture 106 such that the platen 104 is suspended above the interior of the MFP 100. The platen 104 can be transparent planer member, such as a plane of glass, plastic, or other transparent material. In some embodiments, the platen 104 and/or aperture 106 can be rectangular, as shown in FIG. 1.

In some embodiments the MFP 100 can further comprise a lid 108, an output print tray 110, and/or input/output devices 112. The lid 108 can be coupled with the housing via a hinged connection such that it can be raised to expose the platen 104 or lowered to cover the platen 104. The output print tray 110 can hold paper printed inside the MFP 100 and moved to the output print tray 110 until it is removed by a user. The input/output devices 112 can be screens, buttons, keyboards, switches, dials, indicator lights, speakers, and/or any other type of input or output device. By way of a non-limiting example, an input/output device 112 can be a liquid-crystal display (LCD) screen mounted on the housing 102. In some embodiments, screens can be touch-sensitive. In other embodiments, users can interact with screens using other controls such as buttons or keyboards.

Figure 2:
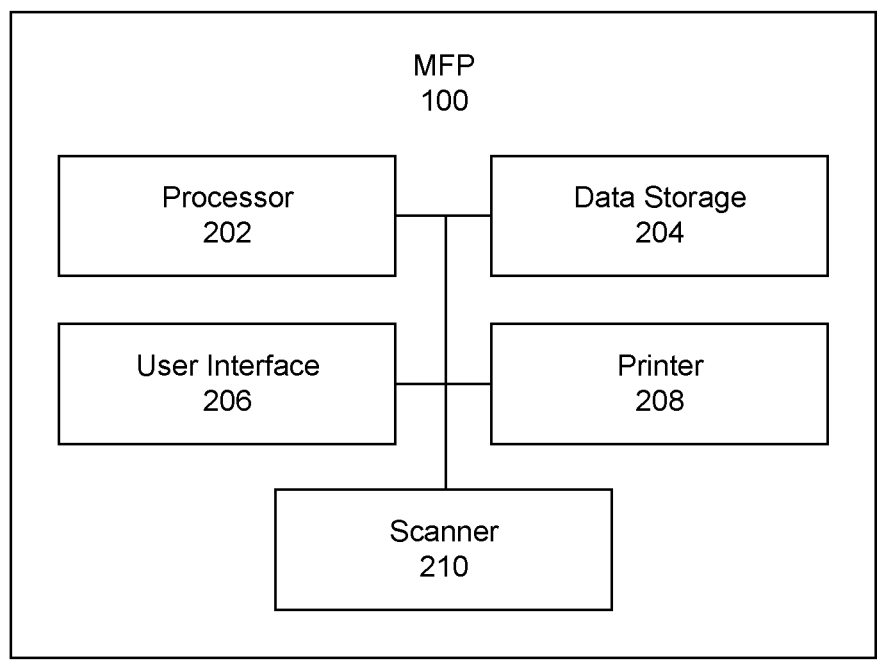
FIG. 2 depicts an embodiment of an MFP's internal components.

As shown in FIG. 2, an MFP 100 can comprise a processor 202, data storage 204, a user interface 206, a printer 208, and a scanner 210.

The processor 202 can be a chip, circuit or controller configured to execute instructions to direct the operations of the MFP 100, such as a central processing unit (CPU), application-specific integrated circuit (ASIC), field-programmable gate array (FPGA), graphics processing unit (GPU), or any other chip, circuit, or controller. In some embodiments a plurality of chips, circuits, and/or controllers can operate together to direct the operations of the MFP 100.

Data storage 204 can be one or more internal and/or external digital storage devices, such as random access memory (RAM), read-only memory (ROM), electrically erasable programmable read-only memory (EEPROM), flash memory, digital tape, a hard disk drive HDD), a solid state drive (SSD), any/or any other type of volatile or non-volatile digital memory. The data storage 204 can store instructions executable by the processor 202 to operate the MFP 100, including an operating system and/or applications.

The user interface 206 can comprise hardware and/or software elements for receiving instructions from users and/or displaying information to users. In some embodiments the user interface 206 can comprise graphical user interfaces and/or other interfaces operable by users through input/output devices 112.

The printer 208 can be a black and white and/or color printer, such as a laser printer or inkjet printer, that is configured to print text and/or images onto paper from a paper tray in the MFP 100. In some embodiments the printer 208 can further comprise a finisher and/or one or more paper cassettes.

The MFP's scanner 210 can be a black and white and/or color scanner configured to scan text and/or images on documents that are either placed on the platen 104 or are placed in a document feeder in the MFP 100 such that the scanner 210 sequentially pulls and scans individual pages from the document feeder.

In some embodiments the printer 208 and scanner 210 can work together in a copy function to scan documents on the platen 104 using the scanner 210 and then print them using the printer 208.

In some embodiments the MFP can further comprise fax components for faxing scanned documents, network components for transmitting data over the internet or any other data network, and/or ports for connecting to other devices, such as USB and Ethernet ports.

Figure 3:
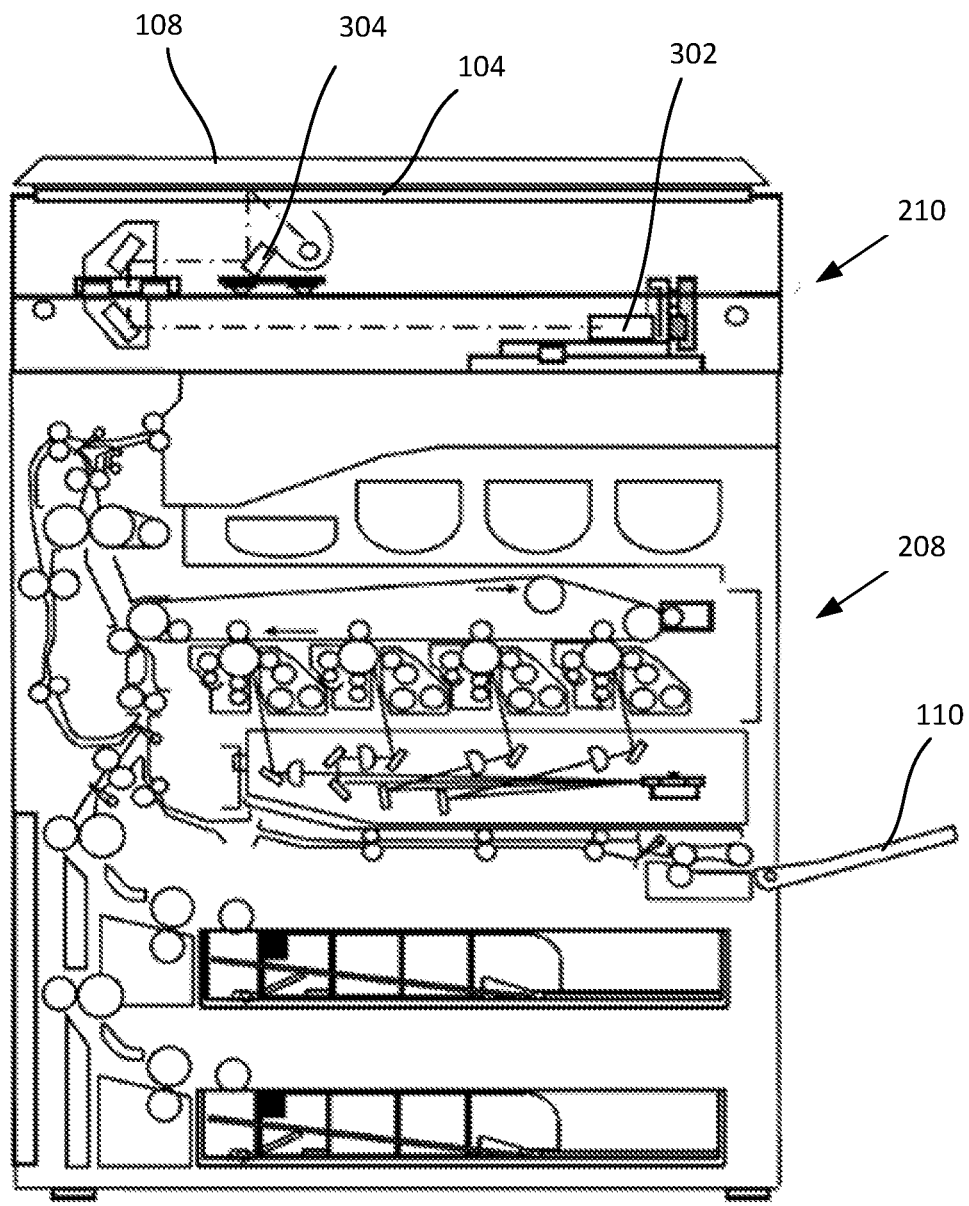
FIG. 3 depicts a cross sectional side view showing the interior of an embodiment of an MFP.

FIG. 3 depicts a cross sectional side view showing the interior of an embodiment of an MFP 100. FIG. 3 depicts the lid 108 lowered such that it covers the platen 104.

As shown in FIG. 3, the scanner 210 can comprise one or more image sensors 302 mounted within the housing 102 below the platen 104. The image sensors 302 can be configured to scan documents placed against the top of the platen 104. By way of a non-limiting example, the image sensors 302 can be coupled with one or more processors 202 and/or data storage 204, such that they can scan a document on the platen 104 and save a digital representation of the document in memory in data storage 204. In some embodiments the image sensors 302 can be contact image sensors (CIS). In other embodiments the image sensors 302 can be charge coupled devices (CCD), or any other type of image sensor.

In some embodiments, the image sensors 302 can be stationary and the MFP 100 can comprise an array of mirrors 304 and/or light sources, at least some of which can be moveable to direct light reflected from different areas of the platen 104 into the image sensors 302, as shown in FIG. 3. In other embodiments the image sensors 302 and/or separate light sources can be movably coupled with the housing 102, such that the image sensors 302 and/or light sources can move below the platen 104 to scan different areas of the platen 104.

Figure 4:
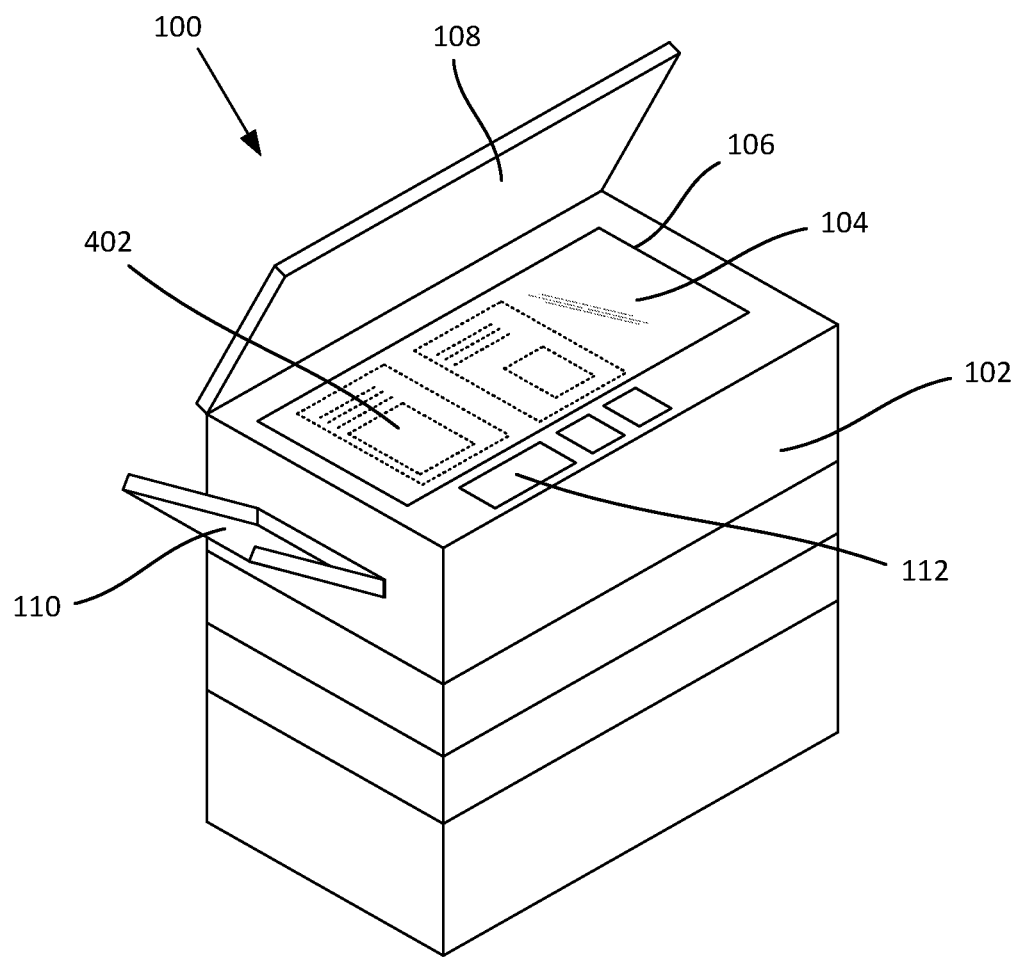
FIG. 4 depicts an embodiment of an MFP displaying a print preview on or through its platen.

As shown in FIG. 4, the MFP 100 can be configured to selectively display one or more images 402 on or through the platen 104. In some embodiments, the platen 104 can be larger than other screens present on the housing 102, allowing more information and/or larger images 402 to be displayed using the platen 104 than on other screens present in the MFP 100. Similarly, in some embodiments, images 402 can be displayed at a higher resolution using the platen 104 than on other screens present in the MFP 100.

In some embodiments, an image 402 can be a print preview and/or scan result displayed on or through the platen 104. By way of a non-limiting example, an image 402 can be a depiction of a document that is ready to be printed by the MFP's printer 208 and/or a depiction of a document that has been scanned by the MFP's scanner 210, as shown in FIG. 4. In some embodiments, a user can use the MFP's user interface 206 to edit a print preview before the document is printed. By way of a non-limiting example, a user can view a print preview of a document on the platen 104, and use the user interface 206 to add or edit text in the document, change its size, or modify any other attribute before printing the document.

In other embodiments, images 402 can be scan lines 1404 or other indicators that indicate the position and/or dimensions of a scan area 1402 on the platen 104 as will be discussed below with reference to FIGS. 14-17, such that a user can see a visual representation of which portions of the platen 104 are currently set to be scanned by the MFP's image sensors 302.

In still other embodiments, images 402 displayed on the platen 104 can be visualizations of components of the user interface 206, such as a keyboard, buttons, sliders, virtual control panels, or any other user interface component. In these embodiments, users can interact with the virtual user interface components in addition to, or in place of, other hardware controls and/or screens. By way of a non-limiting example, a user can interact with a virtual control panel to select functions such as printing or scanning, select a print size and/or quality, change which paper tray to draw from, or change any other desired option.

Figure 5:
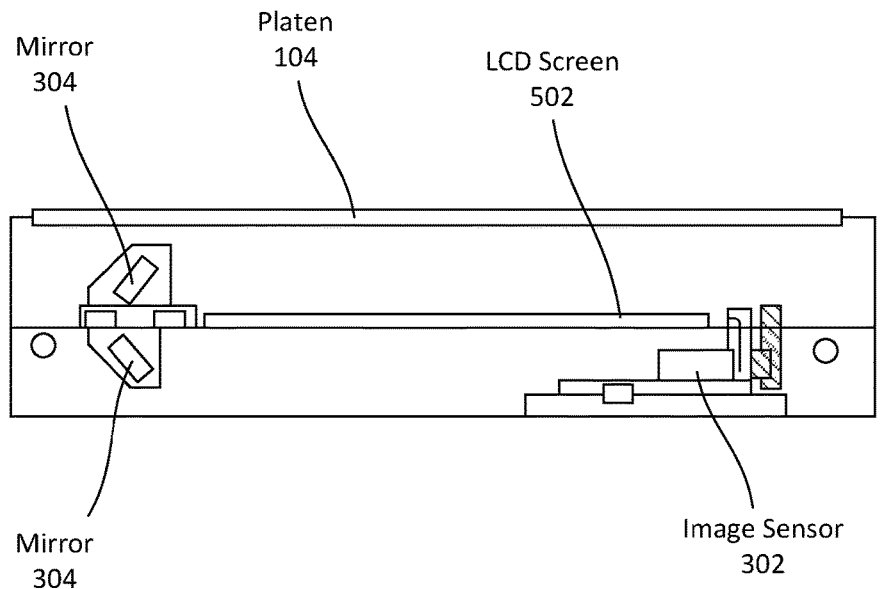
FIG. 5 depicts an exemplary embodiment of an MFP comprising an LCD screen mounted below its platen.
Figure 6:
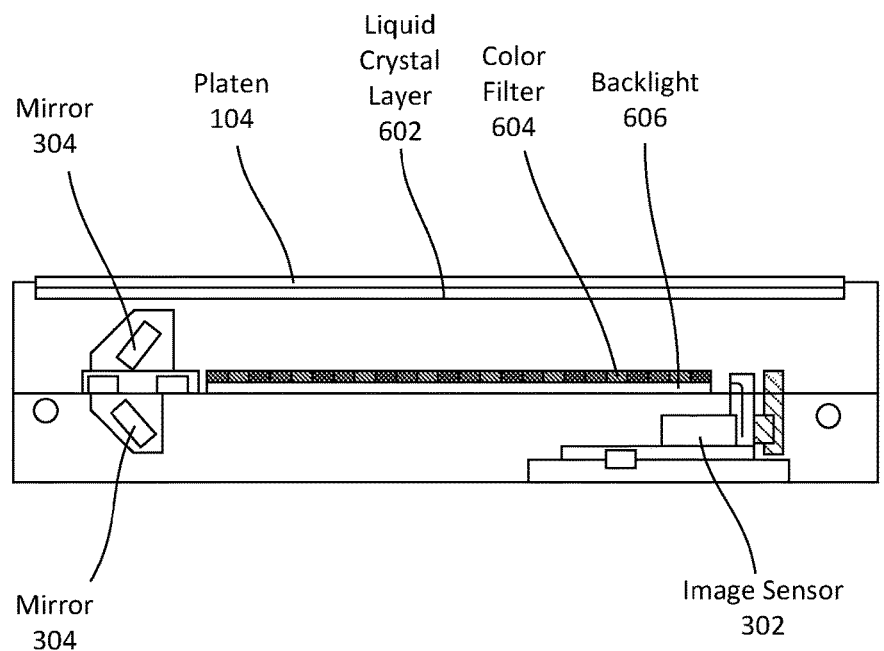
FIG. 6 depicts an exemplary embodiment of an MFP comprising a liquid crystal layer positioned below its platen, and a color filter and backlight mounted below and away from the platen and liquid crystal layer.
Figure 7:
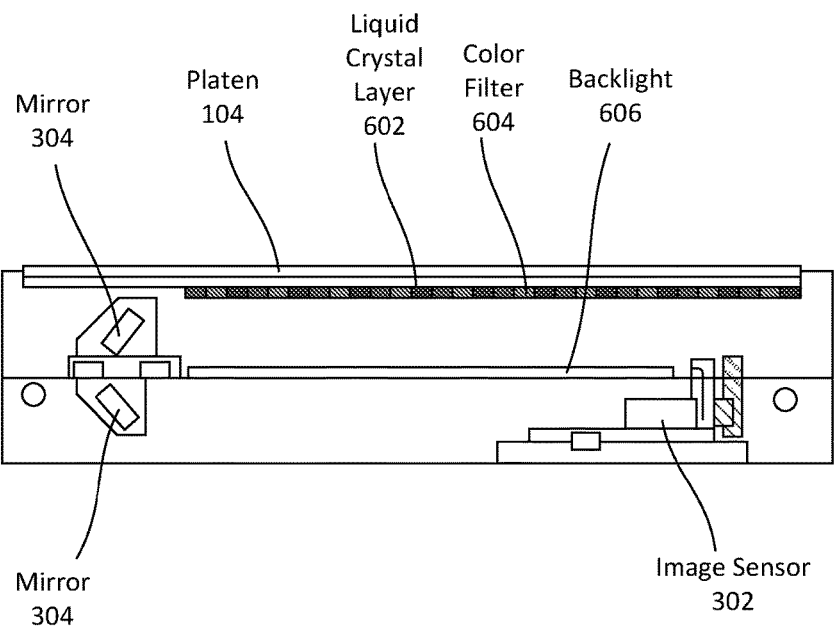
FIG. 7 depicts an exemplary embodiment of an MFP comprising a liquid crystal layer and color filter positioned below its platen, and a backlight mounted below and away from the platen, liquid crystal layer, and color filter.
Figure 8:
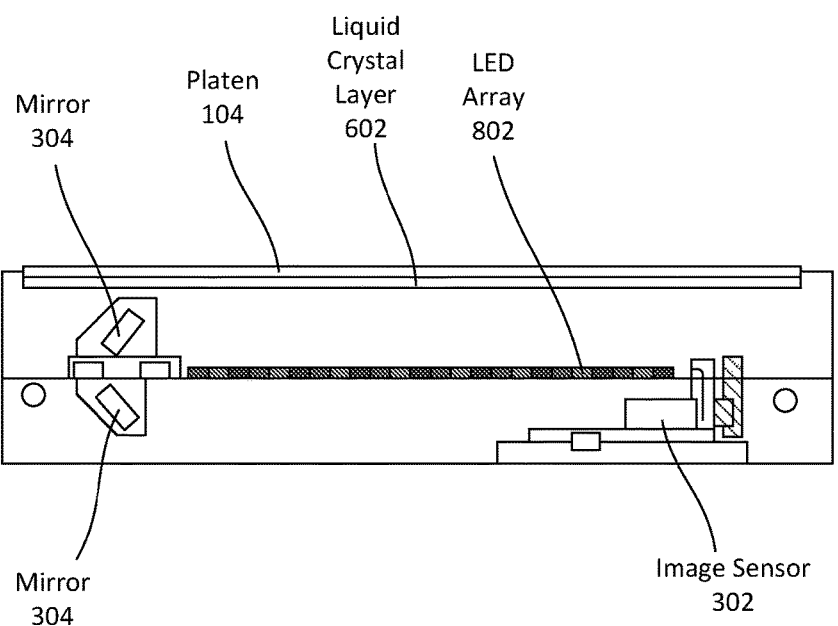
FIG. 8 depicts an exemplary embodiment of an MFP comprising a liquid crystal layer positioned below its platen, and an LED array mounted below and away from the platen and liquid crystal layer.

In some embodiments, the MFP 100 can comprise liquid-crystal display (LCD) components that are configured to selectively display images on or through the platen 104, as shown in the exemplary embodiments of FIGS. 5-8. In some embodiments LCD screen 502 can be mounted below the platen 104 inside the housing 102, as shown in FIG. 5. In other embodiments, a liquid crystal layer 602 can be mounted under the bottom surface of the platen 104, with light sources positioned below the liquid crystal layer 602, as shown in FIGS. 6-8.

In the exemplary embodiment of FIG. 5, the LCD screen 502 can be substantially planar, and can be oriented substantially parallel to the platen 104. The LCD screen 502 can be positioned above the plane of an image sensor 302 and below the platen 104, with mirrors 304 oriented such that light above the LCD screen 502 can be reflected around the LCD screen 502 into the image sensor 302 below the LCD screen 502. In this embodiment, images 402 can be selectively displayed on the LCD screen 502, such that the images 402 are visible to a user on the LCD screen 502 as the user looks downward through the platen 104.

In some embodiments with a scanner comprising a movable array of mirrors 304 and/or light sources that rolls or otherwise moves around between the plane of the platen 104 and image sensor 302, when the MFP 100 is not actively scanning or preparing to scan a document the movable array can move such that it does not obscure the images 402 displayed on the LCD screen 502, such as moving toward a side of the MFP 100 so that it is not over the LCD screen 502.

In the exemplary embodiment of FIG. 6, a color filter 604 and a backlight 606 can be mounted inside the housing 102 below and away from the platen 104 and the liquid crystal layer 602. The color filter 604 and the backlight 606 can be substantially planar, and can be oriented substantially parallel to the platen 104 and liquid crystal layer 602. As shown in FIG. 6, in some embodiments the color filter 604 and the backlight 606 can be positioned above the plane of an image sensor 302 and below the platen 104, with mirrors 304 oriented such that light above the color filter 604 and the backlight 606 can be reflected around the color filter 604 and the backlight 606 into the image sensor 302 below the color filter 604 and the backlight 606.

The liquid crystal layer 602 can comprise a plurality of pixels or sub-pixels that can individually change from transparent to opaque, and vice versa. By way of a non-limiting example, the liquid crystal layer 602 can comprise twisted nematic liquid crystals that twist or untwist depending on the voltage applied to them, such that polarized light either passes through oscillating in its original direction or is twisted to oscillate in a different direction up to 90 degrees from its original direction. The liquid crystal layer 602 can have a polarizer on its top surface that allows polarized light to pass when it oscillates in a specific direction and blocks polarized light from passing when it oscillates in other directions. As such, twisting and untwisting the liquid crystals can either allow light to fully or partially pass through the liquid crystal layer 602 such that the pixel or sub-pixel appears fully or partially illuminated, or be blocked such that the pixel or sub-pixel appears dark.

The backlight 606 can be configured to selectively output light towards the color filter 604. The color filter 604 can have a plurality of sub-pixels tinted red, green, and blue. Light from the backlight 606 that passes through each sub-pixel can thus be tinted red, green, or blue. The combination of which colors of light are allowed to fully or partially pass through the liquid crystal layer 602 can result in the display of almost any color according to the RGB color model. In some embodiments a polarizing filter can be above the backlight 606 or color filter 604, and/or below the liquid crystal layer 602, that polarizes the light output by the backlight 606 into a desired direction such that it can be selectively twisted or left untwisted by the liquid crystal layer 602 as described above.

The MFP 100 can be configured to control the voltage applied to the liquid crystal layer 602 such that it is transparent when the MFP 100 is being used to scan a document that has been placed on the platen 104. The backlight 606 can also be turned off during scanning, such that color filtered light is not being output toward the platen 104. As such, the platen 104 can appear clear, and the image sensor 302 can have an unobstructed view of the document via the mirrors 304.

However, the MFP 100 can activate the backlight 606 and control the amount of red, green, and blue light allowed to pass through individual pixels in the liquid crystal layer 602, such that the pixels can collectively display images 402. Because the liquid crystal layer 602 can be mounted directly under the transparent platen 104, it can appear to users that the images 402 are being displayed on the platen 104.

In some embodiments with a scanner 210 comprising a movable array of mirrors 304 and/or light sources that rolls or otherwise moves around between the plane of the platen 104 and image sensor 302, when the MFP 100 is not actively scanning or preparing to scan a document the movable array can move such that it does not block light passing from the backlight 606 and the color filter 604 toward the liquid crystal layer 602, such as moving toward a side of the MFP 100 so that it is not over the color filter 604 and the backlight 606.

In the exemplary embodiment of FIG. 7, a backlight 606 can be mounted below and away from the platen 104 inside the housing 102, while the liquid crystal layer 602 can be mounted under the bottom surface of the platen 104 and the color filter 604 can be mounted directly below the liquid crystal layer 602. The backlight 606 can output light upward toward the color filter 604, which can tint it red, green, or blue before immediately entering the liquid crystal layer 602. The pixels of the liquid crystal layer 602 can either allow the tinted light to fully or partially pass through the liquid crystal layer 602, or be blocked.

As with the embodiment of FIG. 6, in the embodiment of FIG. 7 the MFP 100 can display images 402 by activating the backlight 606 and controlling the amount of red, green, and blue light allowed to pass through individual pixels in the liquid crystal layer 602. Because the liquid crystal layer 602 can be mounted under the transparent platen 104, it can appear to users that the images 402 are being displayed on the platen 104.

In some embodiments with a scanner 210 comprising a movable array of mirrors 304 and/or light sources that rolls or otherwise moves around between the plane of the platen 104 and image sensor 302, when the MFP 100 is not actively scanning or preparing to scan a document the movable array can move such that it does not block light passing from the backlight 606 toward the color filter 604 and the liquid crystal layer 602, such as moving toward a side of the MFP 100 so that it is not over the backlight 606.

During scanning, in the embodiment of FIG. 7, the MFP 100 can control the voltage applied to the liquid crystal layer 602 such that it is transparent when the MFP 100 is being used to scan a document that has been placed on the platen 104. The MFP 100 can also move the color filter 604 laterally during scanning in coordination with the image sensor 302, such that the image sensor 302 can scan the same line or area of a document through filters of each of the three colors in the color filter 604. By way of a non-limiting example, MFP 100 can move the color filter 604 such that the image sensor 302 scans a particular line of the document through a red filter, move the color filter 604 laterally by the distance of a single sub-pixel such that the image sensor 302 can scan the same line again through a green filter, and then move the color filter 604 laterally again by the distance of a single sub-pixel such that the image sensor 302 can scan the same line again through a blue filter. The image sensor 302 can then move to the next line, and the MFP 100 can again move the color filter 604 so that the next line is scanned three times, once for each color. By scanning the same line or area three times, through a red filter, a green filter, and a blue filter, the image sensor 302 can capture the full color information of the line or area, and reconstruct its original color.

While FIGS. 6 and 7 depict embodiments comprising a color filter 604, in alternate embodiments, the color filter 604 can be absent. In such embodiments, monochrome black and white images 402 can be displayed using the backlight 606 and the liquid crystal layer 602 as non-tinted white light from the backlight 606 is blocked or allowed to pass through the liquid crystal layer 602.

In the exemplary embodiment of FIG. 8, an LED array 802 can be mounted inside the housing 102 below and away from the platen 104 and the liquid crystal layer 602. In this embodiment, the LED array 802 can have a plurality of LEDs (light emitting diodes) that each output red, green, or blue light. The LED array 802 can output red, green, or blue light upward toward the liquid crystal layer 602, and the pixels of the liquid crystal layer 602 can either allow the light of each color to fully or partially pass through the liquid crystal layer 602, or be blocked.

In the embodiment of FIG. 8 the MFP 100 can display images 402 by activating the LED array 802 and controlling the amount of red, green, and/or blue light it outputs from individual LEDs toward each pixel of the liquid crystal layer 602. The MFP 100 can thus control the amount of red, green, and blue light allowed to pass through individual pixels in the liquid crystal layer 602, such that the pixels can collectively display images 402. Because the liquid crystal layer 602 can be mounted under the transparent platen 104, it can appear to users that the images 402 are being displayed on the platen 104.

In some embodiments with a scanner 210 comprising a movable array of mirrors 304 and/or light sources that rolls or otherwise moves around between the plane of the platen 104 and image sensor 302, when the MFP 100 is not actively scanning or preparing to scan a document the movable array can move such that it does not block light passing from the LED array 802 toward the liquid crystal layer 602, such as moving toward a side of the MFP 100 so that it is not over the LED array 802.

During scanning, in the embodiment of FIG. 8, the MFP 100 can control the voltage applied to the liquid crystal layer 602 such that it is transparent when the MFP 100 is being used to scan a document that has been placed on the platen 104. The LED array 802 can also be turned off during scanning, such that colored light is not being output toward the platen 104. As such, the platen 104 can appear clear, and the image sensor 302 can have an unobstructed view of the document via the mirrors 304.

Figure 9:
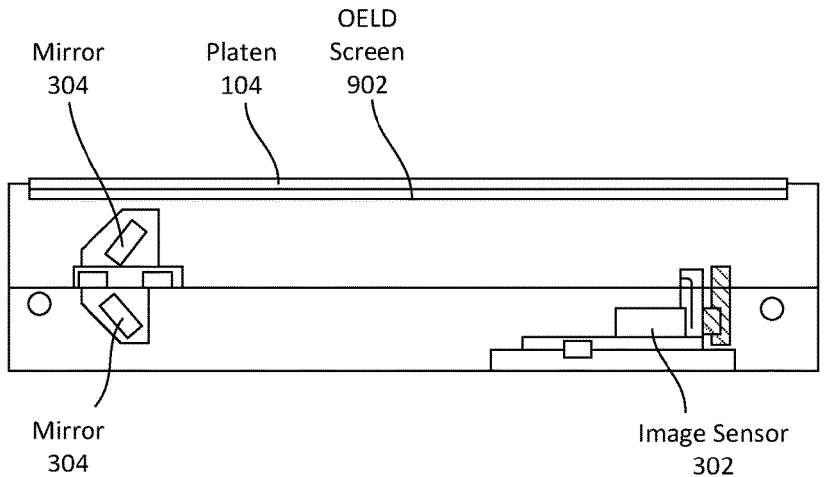
FIG. 9 depicts an exemplary embodiment of an MFP comprising an organic electroluminescent display (OELD) positioned below its platen.

In alternate embodiments, the MFP 100 can comprise an organic electroluminescent display (OELD) 902 configured to selectively display images on or through the platen 104, as shown in the exemplary embodiment of FIG. 9. In this embodiment, the OELD 902 can be mounted on the bottom surface of the platen 104. The OELD 902 can comprise a plurality of pixels that can be selectively illuminated to display images 402 on the OELD 902. Because the OELD 902 can be mounted directly under the transparent platen 104, it can appear to users that the images 402 are being displayed on the platen 104.

The OELD 902 can be transparent when it is not active and displaying images 402. As such, during scanning the MFP 100 can turn off the OELD 902 such that it is transparent, providing the image sensor 302 with an unobstructed view of the document through the clear OELD 902 and clear platen 104.

Figure 10:
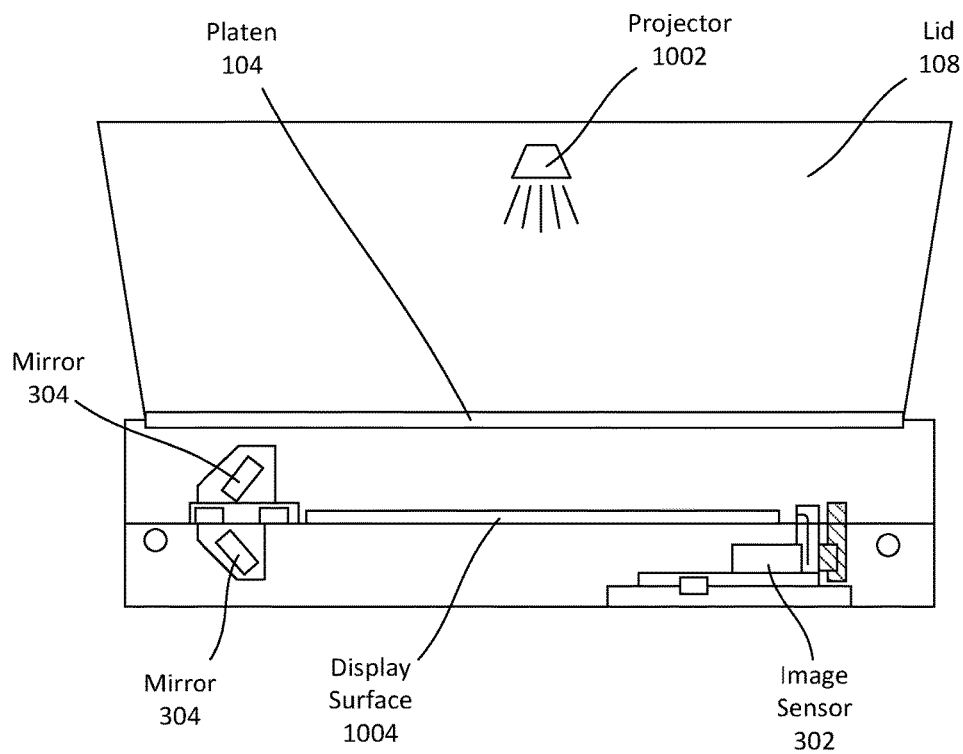
FIG. 10 depicts an exemplary embodiment of an MFP comprising a projector configured to project images through its platen onto a display surface mounted below the platen.

In yet other embodiments, the MFP 100 can comprise a projector 1002 configured to selectively display images on or through the platen 104, as shown in the exemplary embodiment of FIG. 10. The projector 1002 can be mounted above the platen 104. In some embodiments the projector 1002 can be mounted on the lid 108, such that it is raised above the platen 104 when the lid 108 is opened. In other embodiments the projector 1002 can be mounted on any other component that is raised relative to the platen 104, such as on an auto document feeder, a raised protrusion, mounted on a wall or ceiling above the MFP 100, or on any other component.

In this embodiment, a display surface 1004 can be mounted below the platen 104 inside the housing 102. The display surface 1004 can be a planar member, such as a white plate, oriented substantially parallel to the platen 104. As shown in FIG. 10, in some embodiments the display surface 1004 can be positioned above the plane of the image sensor 302 and below the platen 104, with mirrors 304 oriented such that light above the display surface 1004 can be reflected around the display surface 1004 into the image sensor 302 below the display surface 1004.

In the embodiment of FIG. 10, the projector 1002 can selectively project images 402 through the platen 104 onto the display surface 1004, such that the images 402 are visible to a user on the display surface 1004 as the user looks downward through the platen 104.

In some embodiments with a scanner 210 comprising a movable array of mirrors 304 and/or light sources that rolls or otherwise moves around between the plane of the platen 104 and image sensor 302, when the MFP 100 is not actively scanning or preparing to scan a document the movable array can move such that it does not block images projected from the projector 1002 from reaching the display surface 1004, such as moving toward a side of the MFP 100 so that it is not over the display surface 1004.

Figure 11:
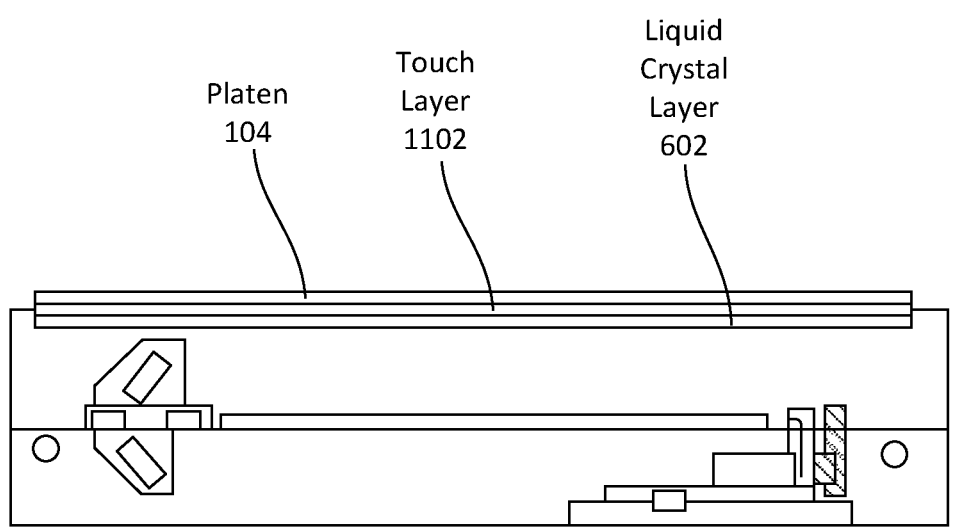
FIG. 11 depicts an exemplary embodiment of an MFP comprising a touch layer.

In some embodiments, the platen 104 can be touch-sensitive. By way of a non-limiting example, the platen 104 can comprise or be coupled to a touch layer 1102, as shown in FIG. 11. A touch layer 1102 can comprise capacitive material, such as electrodes, arranged in lines and/or grids such that a user's touch against the touch layer 1102 causes a change in an electrostatic field that can be detected to determine the coordinates of the touch. The touch layer 1102 can be coupled with a processor 202 or touch controller, such that the MFP 100 can use detected touches as part of its user interface 206.

In some embodiments a touch layer 1102 can be a separate layer positioned above or below the platen 104. In some embodiments in which a liquid crystal layer 602 is mounted under the platen 104, a touch layer 1102 can be sandwiched between the liquid crystal layer 602 and the platen 104. In other embodiments, the touch layer 1102 can be positioned above the platen 104.

In alternate embodiments, the platen 104 can be touch sensitive via infrared emitters and detectors spaced around the platen 104, such that a user's touch can be detected when infrared light is blocked by the user's finger, or through any other touch-sensitive layer or device.

In some embodiments a touch-sensitive platen 104 can be used instead of, or in addition to, other screens mounted on the housing 102. By way of a non-limiting example, the MFP 100 can display images 402 such as an operations panel on or through the platen 100 as described above, and a user can touch the touch-sensitive platen 104 to interact with the operations panel images 402 and to thereby control the MFP's operations.

In some embodiments the MFP 100 can further comprise a cleaning unit 1202 configured to clean surfaces of the platen 104 or touch layer 1102. By way of a non-limiting example, when the platen 104 is touch-sensitive, the cleaning unit 1202 can be configured to remove smudges or fingerprints left by users when they interact with the touch-sensitive platen 104, such that such smudges or fingerprints are less likely to interfere with scanning documents placed on the platen 104.

Figure 12:
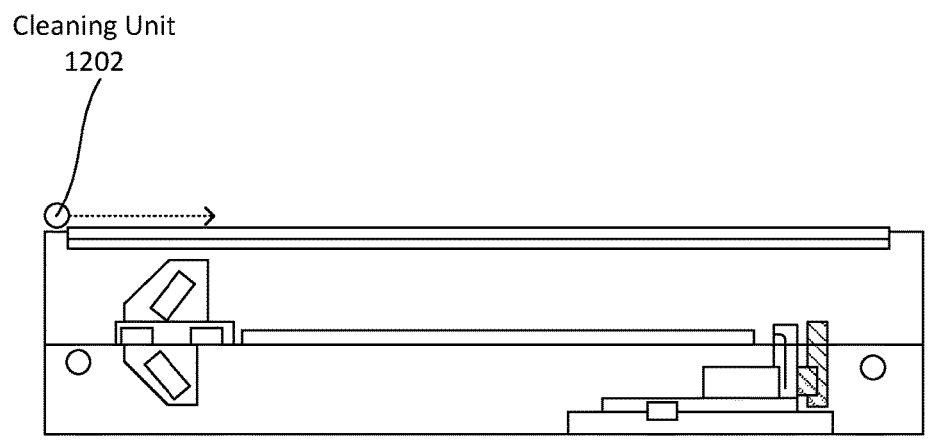
FIG. 12 depicts an exemplary embodiment of an MFP comprising a cleaning unit.
Figure 13:
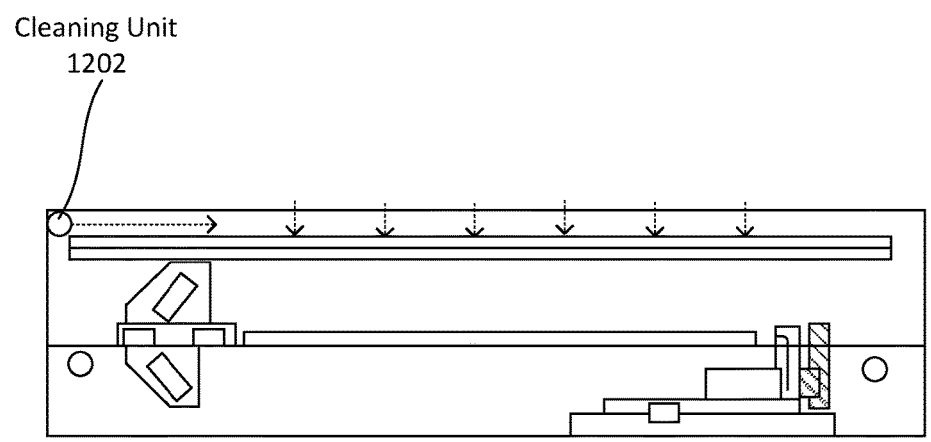
FIG. 13 depicts an exemplary embodiment of an MFP comprising a cleaning unit and a lowerable platen.

As shown in FIG. 12, in some embodiments the cleaning unit 1202 can comprise a movable pad, roll, brush, or any other cleaning element that is configured to slide across and clean the surface of the platen 104 or touch layer 1102. In some embodiments the cleaning unit 1202 can be positioned on the underside of the lid 108, such that it can move under the lid 108 against the platen 104 or touch layer 1102 when the lid 108 is closed. In other embodiments the cleaning unit 1202 can be mounted on movable and/or mechanized components coupled with the housing 102, such that the cleaning unit 1202 can move across the surface of the platen 104 or touch layer 1102 when the lid 108 is open. In still other embodiments the cleaning unit 1202 can be mounted inside the housing 102, and the platen 104, touch layer 1102, and/or other components such as a liquid crystal layer 602 can be configured to drop below the plane of the cleaning unit 1202, as shown in FIG. 13. In the embodiment of FIG. 13, the platen 104, touch layer 1102, and/or other components can be lowered during cleaning, such that the cleaning unit 1202 can move across the lowered components before they are raised back to their original position after cleaning is complete.

Figure 14:
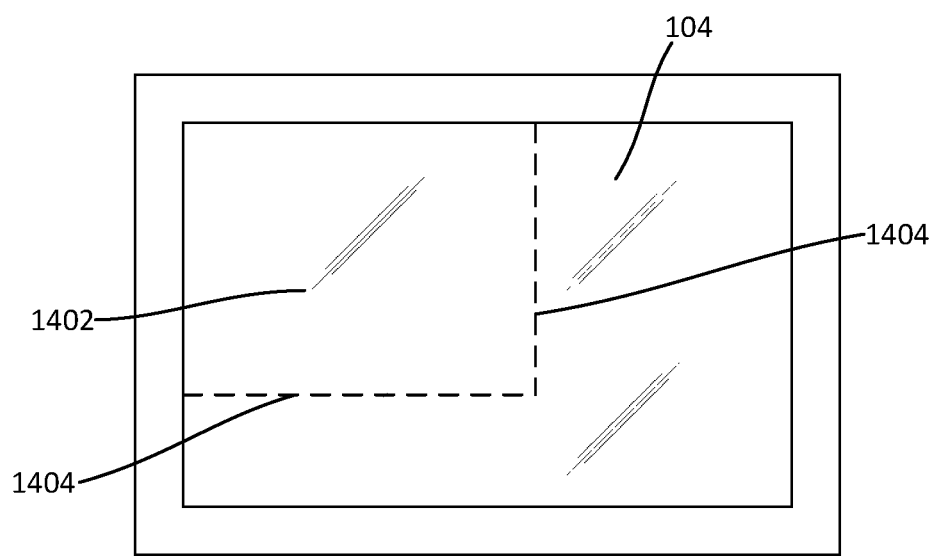
FIG. 14 depicts scan lines displayed on the platen to illustrate the boundaries of a scan area.

As described above, in some embodiments one or more images 402 displayed on or through the platen 104 can be representations of the position and/or boundaries of a scan area. FIG. 14 depicts an embodiment in which the boundaries of a scan area 1402 are illustrated with images 402 such as scan lines 1404. The scan area 1402 can be an area of the platen 104 that will be scanned by one or more image sensors 302 to create a digital representation of documents, photographs, or anything else placed above the platen 104 within the scan area 1402. In some embodiments the image sensors 302 can scan only within the designated scan area 1402. In alternate embodiments the image sensors 302 can scan the full platen 104, and the MFP 100 can then crop the resulting digital representation down to a section corresponding to the position and dimensions of the designated scan area 1402.

Figure 15A:
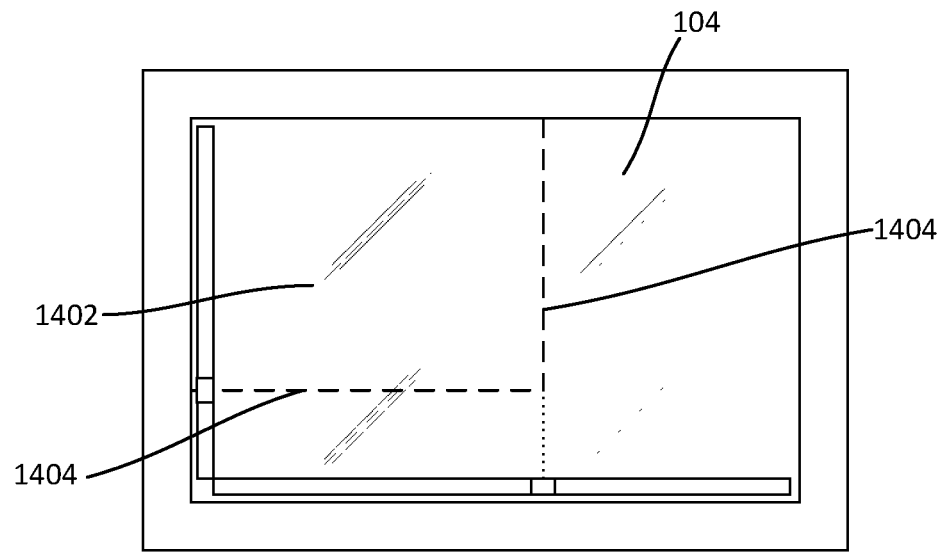
FIGS. 15A-15B depict one embodiment of an interface for moving scan lines and adjusting the dimensions of a scan area.
Figure 15B:
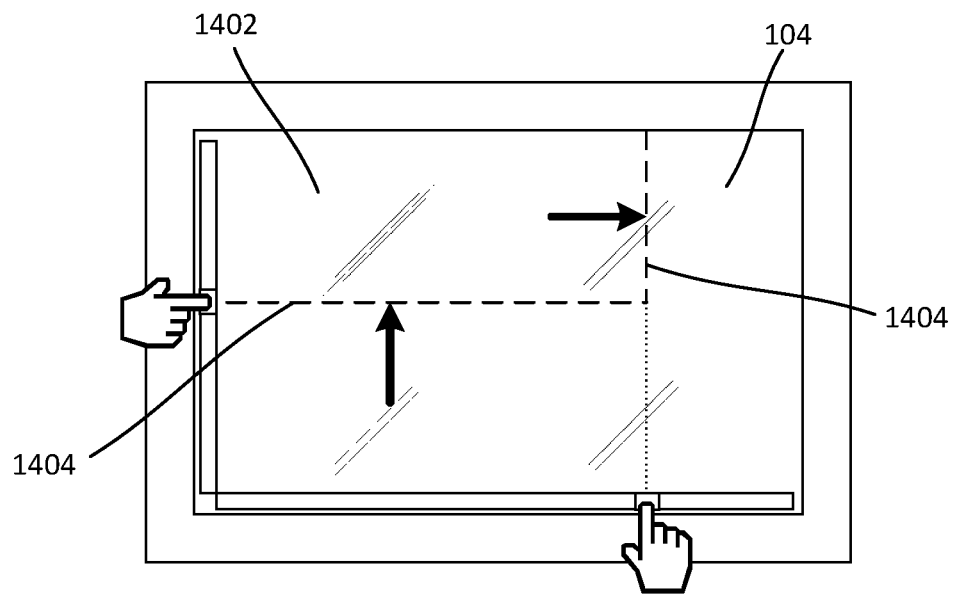
Figure 16A:
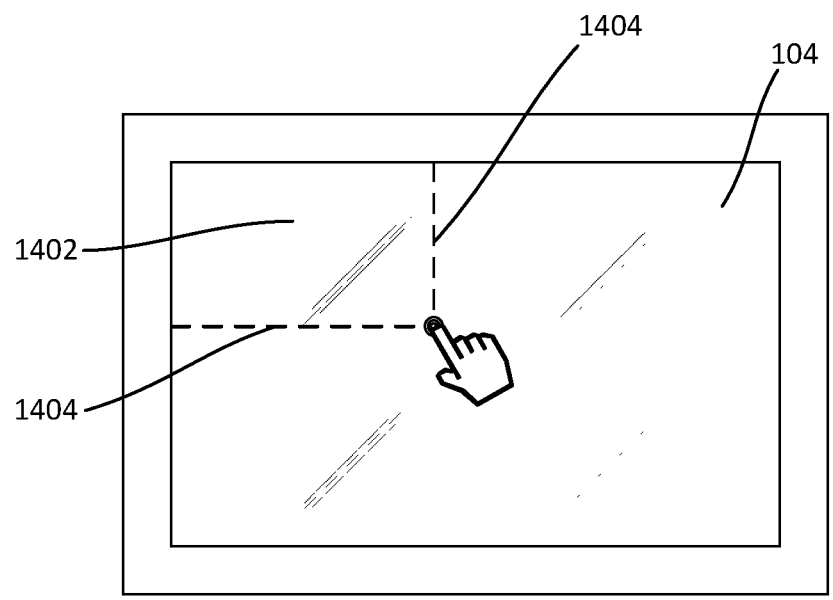
FIGS. 16A-16B depict another embodiment of an interface for moving scan lines and adjusting the dimensions of a scan area.
Figure 16B:
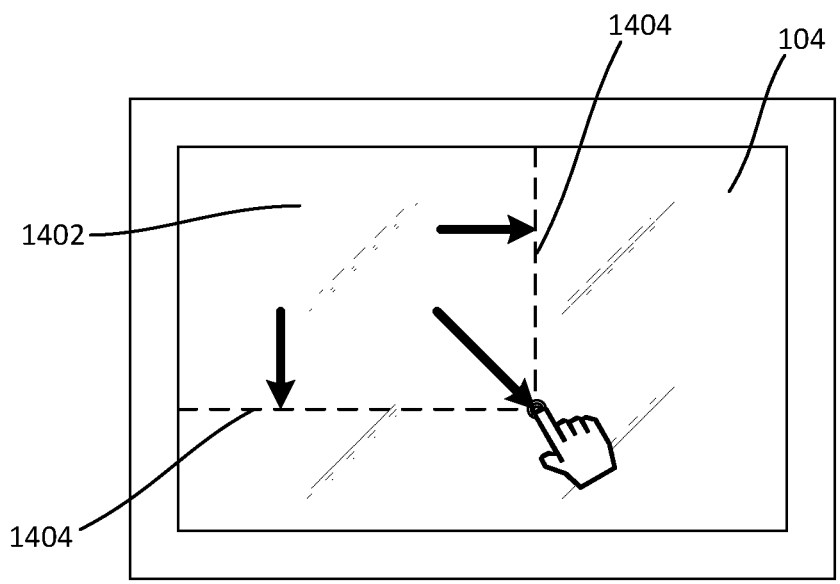
Figure 17:
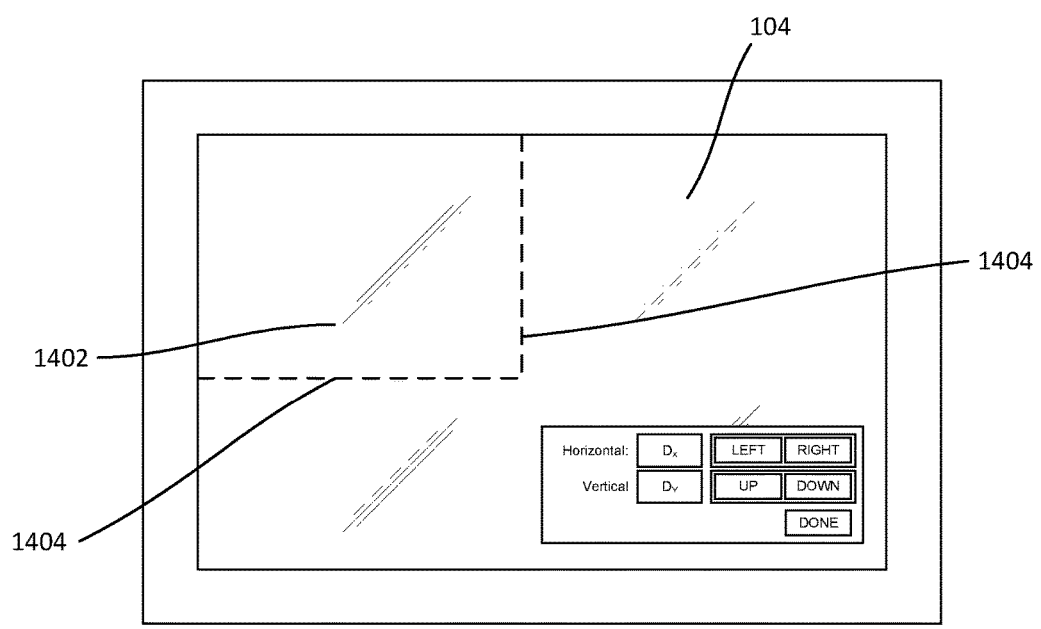
FIG. 17 depicts another embodiment of an interface for moving scan lines and adjusting the dimensions of a scan area.

In some embodiments the MFP 100 can be configured to allow users to change the position and/or dimensions of the scan area 1402 through a user interface 206. In some embodiments in which the platen 104 is touch-sensitive, users can touch and/or drag virtual sliders displayed as images 402 on the platen 104, or tap positions along a strip, to move associated scan lines 1404 and thereby adjust the dimensions of the scan area 1402, as shown in FIGS. 15A-15B. In other embodiments, users can directly touch and drag one or both scan lines 1404 on a touch-sensitive platen 104 to adjust the dimensions of the scan area 1402. In yet other embodiments, a user can touch a position on the platen 104 corresponding to a corner of the scan area 1402 and drag or otherwise move the corner of the scan area 1402 to another position on the platen 104, to adjust the dimensions of the scan area 1402, as shown in FIGS. 16A-16B. In still other embodiments, a control panel can be displayed as an image 402 on the platen 104, such that users can touch virtual buttons on the control panel to move scan lines 1404, as shown in FIG. 17.

In alternate embodiments, the user can alternately or additionally use hardware controls and/or a separate touch or non-touch screen on the housing 102 to move scan lines 1404 to adjust the dimensions of the scan area 1402, and/or to enter the dimensions of a desired scan area 1402 whereupon the display of the scan lines 1404 on the platen 104 can be moved to reflect the new dimensions of the scan area 1402.

After users have adjusted the scan area 1402 to a desired position and dimensions, the user can confirm their selection and begin scanning. Display of the images 402 and/or scan lines 1404 can be deactivated such that the platen 104 is transparent, and the image sensors 302 can then scan documents or other items placed within the scan area 1402 on the platen 104.

Although the invention has been described in conjunction with specific embodiments thereof, it is evident that many alternatives, modifications and variations will be apparent to those skilled in the art. Accordingly, the invention as described and hereinafter claimed is intended to embrace all such alternatives, modifications and variations that fall within the spirit and broad scope of the appended claims.

What is claimed is:

1. A multifunctional printer, comprising:
a housing defining an aperture;
a platen comprising transparent material, the platen spanning the aperture;
a liquid crystal layer mounted below the platen inside the housing;
a light source mounted below the platen inside the housing, at a distance from the liquid crystal layer; and
an image sensor mounted below the platen, the image sensor being configured to scan documents placed above the platen, wherein the liquid crystal layer is configured to be transparent when the image sensor is scanning a document but selectively display images on the platen when the image sensor is not scanning a document, by selectively blocking or letting light emitted by the light source pass through the liquid crystal layer, wherein the platen is coupled with a touch-sensitive layer, such that touches from a user on the platen can be detected to interact with images displayed on the platen, wherein an image displayed on the platen is a scan boundary indicator illustrating dimensions of a scan area, and a user can move the scan boundary indicator using the touch-sensitive layer to change the dimensions of the scan area, wherein the scan boundary indicator includes a first scan boundary indicator and a second scan boundary indicator, the first scan boundary indicator is illustrated in a line shape extending in a horizontal direction and the second scan boundary indicator is illustrated in a line shape extending in a vertical direction, a first strip is illustrated along a vertical side of the platen and a second strip is illustrated along a horizontal side of the platen, the first scan boundary indicator is configured to move in the vertical direction according to a first touch inputted by user on the first strip and the second scan boundary indicator is configured to move in the horizontal direction according to a second touch inputted by the user on the second strip.

2. The multifunctional printer of claim 1, wherein the light source is a backlight and a color filter is positioned between the backlight and the liquid crystal layer.

3. The multifunctional printer of claim 2, wherein the color filter is positioned on the backlight.

4. The multifunctional printer of claim 2, wherein the color filter is positioned under the liquid crystal layer, apart from the backlight.

5. The multifunctional printer of claim 4, wherein the color filter is movable during scanning such that each line of a document is scanned by the image sensor multiple times, once for each color present in the color filter, to reconstruct each line's original color from multiple scans tinted in different colors.

6. The multifunctional printer of claim 1, wherein the light source is an LED array.

7. The multifunctional printer of claim 1, wherein an image displayed on the platen is a print preview.

8. The multifunctional printer of claim 1, wherein an image displayed on the platen is a user interface component.

9. The multifunctional printer of claim 1, wherein an image displayed on the platen is a scan boundary indicator illustrating dimensions of a scan area.

10. The multifunctional printer of claim 1, wherein an image displayed on the platen is a user interface component, and a user can interact with the user interface component using the touch-sensitive layer.

11. The multifunctional printer of claim 1, further comprising a cleaning unit configured to mechanically move across and clean a surface of the platen and/or the touch-sensitive layer.

12. The multifunctional printer of claim 11, wherein the cleaning unit is mounted inside the housing, and the platen and the touch-sensitive layer are mechanically lowerable to a position inside the housing such that the cleaning unit is configured to move across the surface of the platen and/or the touch-sensitive layer in their lowered position.

13. A multifunctional printer, comprising:
a housing defining an aperture;
a platen comprising transparent material, the platen spanning the aperture; and
a liquid crystal display screen mounted below the platen inside the housing, at a distance from the platen,
wherein the liquid crystal display screen is configured to selectively display images visible through the platen,
wherein the platen is coupled with a touch-sensitive layer, such that touches from a user on the platen can be detected to interact with images displayed on the platen,
wherein an image displayed on the platen is a scan boundary indicator illustrating dimensions of a scan area, and a user can move the scan boundary indicator using the touch-sensitive layer to change the dimensions of the scan area,
wherein the scan boundary indicator includes a first scan boundary indicator and a second scan boundary indicator, the first scan boundary indicator is illustrated in a line shape extending in a horizontal direction and the second scan boundary indicator is illustrated in a line shape extending in a vertical direction, a first strip is illustrated along a vertical side of the platen and a second strip is illustrated along a horizontal side of the platen, the first scan boundary indicator is configured to move in the vertical direction according to a first touch inputted by user on the first strip and the second scan boundary indicator is configured to move in the horizontal direction according to a second touch inputted by the user on the second strip.

14. The multifunctional printer of claim 13, wherein an image displayed on the liquid crystal display screen is a scan boundary indicator illustrating the dimensions of a scan area, and wherein the platen is coupled with a touch-sensitive layer configured to detect touches from a user on the platen, such that the scan boundary indicator displayed on the liquid crystal display screen is configured to move in response to detected touches and the dimensions of the scan area changes to correspond to a new position of the scan boundary indicator.

15. The multifunctional printer of claim 13, further comprising a cleaning unit mounted inside the housing, wherein the platen and a touch-sensitive layer are mechanically lowerable to a position inside the housing such that the cleaning unit is configured to move across a surface of the platen and/or a touch-sensitive layer in their lowered position.

16. A multifunctional printer, comprising:
a housing defining an aperture;
a platen comprising transparent material, the platen spanning the aperture;
an organic electroluminescent display coupled with the platen; and
an image sensor mounted below the platen, the image sensor being configured to scan documents placed above the platen,
wherein the organic electroluminescent display is configured to be transparent when the image sensor is scanning a document but selectively display images on the platen when the image sensor is not scanning a document,
wherein the platen is coupled with a touch-sensitive layer, such that touches from a user on the platen can be detected to interact with images displayed on the platen,
wherein an image displayed on the platen is a scan boundary indicator illustrating dimensions of a scan area, and a user can move the scan boundary indicator using the touch-sensitive layer to change the dimensions of the scan area, wherein the scan boundary indicator includes a first scan boundary indicator and a second scan boundary indicator, the first scan boundary indicator is illustrated in a line shape extending in a horizontal direction and the second scan boundary indicator is illustrated in a line shape extending in a vertical direction, a first strip is illustrated along a vertical side of the platen and a second strip is illustrated along a horizontal side of the platen, the first scan boundary indicator is configured to move in the vertical direction according to a first touch inputted by user on the first strip and the second scan boundary indicator is configured to move in the horizontal direction according to a second touch inputted by the user on the second strip.

17. The multifunctional printer of claim 16, wherein an image displayed on the platen is a scan boundary indicator illustrating the dimensions of a scan area, and wherein the platen is coupled with a touch-sensitive layer configured to detect touches from a user on the platen, such that the scan boundary indicator displayed on the platen is configured to move in response to detected touches and the dimensions of the scan area changes to correspond to the scan boundary indicator's new position.

18. The multifunctional printer of claim 16, further comprising a cleaning unit mounted inside the housing, wherein the platen and a touch-sensitive layer are mechanically lowerable to a position inside the housing such that the cleaning unit is configured to move across a surface of the platen and/or a touch-sensitive layer in their lowered position.

* * * * *